United States Patent
Bijker et al.

(10) Patent No.: US 6,946,404 B2
(45) Date of Patent: Sep. 20, 2005

(54) METHOD FOR PASSIVATING A SEMICONDUCTOR SUBSTRATE

(75) Inventors: Martin Dinant Bijker, Helmond (NL); Franciscus Cornelius Dings, Veldhoven (NL); Mauritius Cornelis Maria Van De Sanden, Tilburg (NL); Michael Adrianus Theodorus Hompus, Helmond (NL); Wilhelmus Mathijs Marie Kessels, Tilburg (NL)

(73) Assignee: OTB Group B.V., Eindhoven (NL)

( * ) Notice: Subject to any disclaimer, the term of this patent is extended or adjusted under 35 U.S.C. 154(b) by 62 days.

(21) Appl. No.: 10/452,929

(22) Filed: Jun. 3, 2003

(65) Prior Publication Data

US 2004/0029334 A1 Feb. 12, 2004

(30) Foreign Application Priority Data

May 21, 2002 (NL) .............................................. 1020634

(51) Int. Cl.$^7$ ........................ H01L 21/31; H01L 21/469
(52) U.S. Cl. ...................... 438/778; 438/788; 438/791; 438/792; 438/958
(58) Field of Search ................................ 438/770, 778, 438/788, 791, 792, 958, 162; 136/261

(56) References Cited

U.S. PATENT DOCUMENTS

| | | | |
|---|---|---|---|
| 4,223,048 A | 9/1980 | Engle, Jr. | |
| 4,664,747 A | 5/1987 | Sekiguchi et al. | |
| 5,534,445 A | * 7/1996 | Tran et al. | 438/162 |
| 5,871,591 A | * 2/1999 | Ruby et al. | 136/261 |
| 6,091,021 A | 7/2000 | Ruby et al. | |

FOREIGN PATENT DOCUMENTS

| | | |
|---|---|---|
| DE | 198 12 558 A1 | 9/1999 |
| EP | 0 887 437 A2 | 12/1998 |
| EP | 0 887 737 A3 | 4/2001 |

OTHER PUBLICATIONS de Graaf et al., "Amorphous hydrogenated carbon nitride films deposited via an expanding thermal plasma at high growth rate," Thin Solid Films 333:29–34 (1998).

Soppe et al., "A high throughput PECVD reactor for deposition of passivating SiN layers," 16$^{th}$ EPVSEC (European Photovoltaic Solar Energy Conference and Exhibition) Glasgow, May 2000.

Soppe et al., "Bulk and surface passivation by silicon nitride grown by remote microwave PECVD," Paper No. VC 1.38, pp. 1–4, 17$^{th}$ EPVSEC, Munich, 2001.

* cited by examiner

*Primary Examiner*—David Nelms
*Assistant Examiner*—Renee R. Berry
(74) *Attorney, Agent, or Firm*—Pillsbury Winthrop Shaw Pittman LLP

(57) ABSTRACT

A method for the passivation of a semiconductor substrate, wherein a SiN$_x$:H layer is deposited on the surface of the substrate (1) by means of a PECVD process comprising the following steps:

Figure 1:
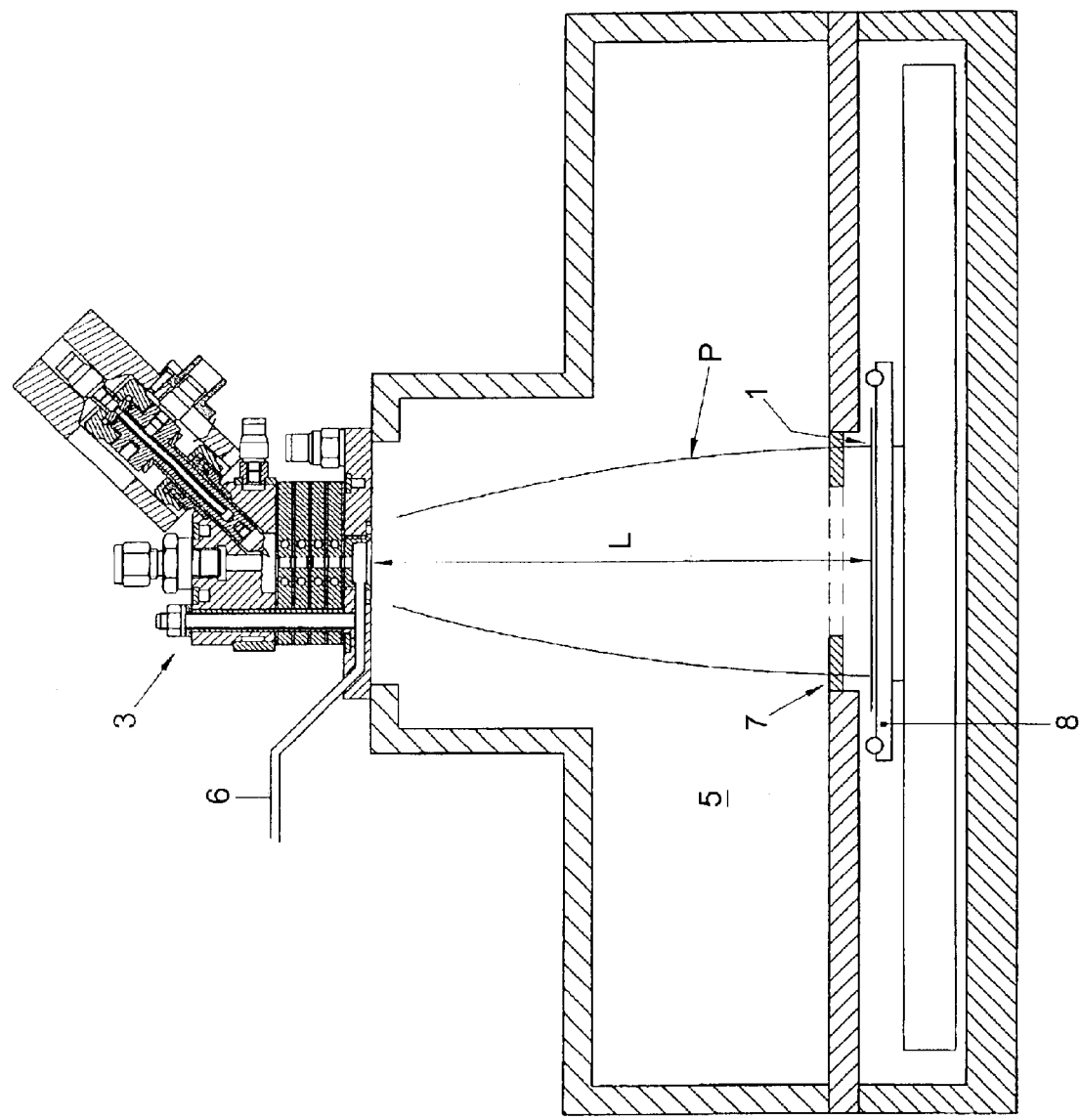

the substrate (1) is placed in a processing chamber (5) which has specific internal processing chamber dimensions;

the pressure in the processing chamber is maintained at a relatively low value;

the substrate (1) is maintained at a specific treatment temperature;

a plasma (P) is generated by at least one plasma cascade source (3) mounted on the processing chamber (5) at a specific distance (L) from the substrate surface;

at least a part of the plasma (P) generated by each source (3) is brought into contact with the substrate surface; and flows of silane and ammonia are supplied to said part of the plasma (P).

21 Claims, 2 Drawing Sheets

METHOD FOR PASSIVATING A SEMICONDUCTOR SUBSTRATE

The invention relates to a method for passivating a semiconductor substrate.

Such a method is known from practice, see the publication "A high throughput PECVD reactor for deposition of passivating SiN layers", presented at the 16$^{th}$ EPVSEC (European Photovoltaic Solar Energy Conference and Exhibition) in May 2000 in Glasgow by W. J. Soppe et al. In this method, a SiN$_x$:H layer is deposited on a relatively large number of substrates simultaneously by means of a plasma enhanced chemical vapor deposition (PECVD) process. In this, silane and ammonia are used as reaction gases.

For carrying out the known method, a Roth&Rau plasma source arranged in a processing chamber is used. This source is provided with two parallel quartz tubes with a copper antenna. During use, the substrates to be treated are placed under the plasma source in this processing chamber. Then a plasma is generated by the source, with the process gases silane and ammonia being supplied to that plasma. Under the influence of inter alia the plasma and strong electromagnetic fields, the process gases dissociate into various radicals that effect the growth of the SiN$_x$:H layer on the substrate surface. The EM fields are generated by RF alternating voltages.

The SiN$_x$:H layers deposited on the substrates are relatively hard and scratch-resistant and, in addition, virtually impermeable to water. Furthermore, these SiN$_x$:H layers can each serve as, for instance, an anti-reflection layer, with the layer reducing an undesired reflection of light incident on the substrate. Such reflection is undesired when, for instance, the substrate is used in a solar cell.

Furthermore, the SiN$_x$:H layers are advantageous with regard to repair of dislocations present in the substrates. The fact is that these dislocations can be repaired, at least partly, in a known manner by means of hydrogen passivation using atomic hydrogen from the SiN$_x$:H layer. In this manner, a substrate with good photoelectrical properties can be obtained.

The hydrogen passivation mentioned can comprise both bulk and surface passivation, whereby lattice defects in the bulk and surface of the substrate respectively are repaired. A good surface passivation is usually related to a good blue response of the substrate. This means that a relatively large amount of blue light incident on the substrate, which can usually penetrate into the substrate over a short distance only, releases charge carriers in the substrate. The charge carriers can comprise free electrons in the conduction band and/or holes in the valence band. A substrate showing both a good red response and a good blue response is, for instance, very suitable to form the basic material for an efficient solar cell.

A disadvantage of the known method is that, with the remote PECVD process used in this method, only a relatively low growth rate, 1 nm/s, of the SiN$_x$:H layer can be achieved. Furthermore, for carrying out this method, an apparatus is used which comprises a relatively large plasma source which is provided with a relatively long quartz tube with a copper antenna, with the tube extending along the substrate processing chamber. This makes repair and/or replacement of that plasma source more difficult. Moreover, such a source is not advantageous when only one single substrate is to be treated, in view of an attendant high consumption of energy, silane and ammonia. In addition, the HF alternating voltage used by the source needs to be repeatedly adjusted during growth in order to obtain a constant growth rate. This repeated adjustment of the alternating voltage can be attributed to inter alia a change of the source impedance due to the growth of the electrically insulating layer on the substrate.

The present invention has as its object a method which removes the disadvantages mentioned. In particular, the invention has as its object a method by which a SiN$_x$:H layer can be deposited on a substrate in a simple manner.

For this purpose, the method according to the invention is characterized by the measures of claim 1.

In this manner, a SiN$_x$:H layer can be applied to the substrate relatively fast. Because the substrate is placed in a processing chamber of which the pressure is relatively low, the deposition can take place under relatively clean conditions, so that relatively little pollution is incorporated in the layer. The plasma cascade source mentioned can generate the plasma at a relatively high, internal working pressure. The relatively low pressure of the processing chamber has the further advantage that the plasma from the plasma cascade source can leave the plasma source arranged on the processing chamber at a relatively high speed, in particular virtually supersonic, for the treatment of the substrate. In this manner, the plasma can be well bundled and aimed at the substrate, which further leads to the desired, relatively high growth rate of the layer. This bundling method makes an in-line method for applying the SiN$_x$:H layer to the substrate possible. In addition, the plasma cascade source is a source that is relatively easily to maintain. This method is particularly well suitable to treat a single substrate, because the cascade source can generate a plasma bundle that is well attuned to the dimensions of the substrate surface.

Process parameters of the PECVD process, at least the processing chamber pressure, the flows of silane and ammonia, the substrate temperature, the dimensions of the processing chamber and the distance between the at least one plasma source and the substrate surface are preferably such that a SiN$_x$:H layer is deposited on the substrate with a growth rate that is higher than 5 nm/s, in particular higher than 15 nm/s.

For this purpose, the process parameters preferably have the following values:
- the flow of silane per source is higher than 0.05 slm (standard liter per minute) and is in particular in the range of 0.005–1.0 slm
- the flow of ammonia per source is higher than approximately 0.2 slm and is in particular in the range of 0.2–2.5 slm
- the distance between the plasma outlet opening of the at least one source and the substrate is in the range of 100 mm–750 mm
- the substrate temperature is in the range of 350–450° C.

The SiN$_x$:H layer obtained using the method according to the invention is found to lead to good bulk and/or surface passivation of the substrate, such that a good blue response is observed. In this method, a substrate with an open terminal voltage of approximately 610 mV is obtained, which substrate gives both a red and a blue response.

According to a further elaboration of the invention, both sides of the substrate can be subjected to a treatment according to the invention. This further enhances the advantages of the method according to the invention.

Furthermore, according to a further elaboration of the invention, the ratio between the flow of the silane and the flow of the ammonia can be varied when applying the SiN$_x$:H. The result of this is that the refractive index of the layer to be applied is varied. Especially for the production of solar cells, this can be highly important because this can result in an improved efficiency of the solar cells. To be considered here is an efficiency improvement of 0.2%, which is a significant improvement. As is well-known, a solar panel is usually built up from a glass plate on which an EVA film is placed. On this EVA film, the substrates are present that are provided with the $SiN_x$:H layer. The refractive index of glass is approximately 1.5, that of EVA is approximately 1.7, and that of silicon is 3.44. The $SiN_x$:H layer can have a graded refractive index increasing from, for instance, 1.9–2.2 across the thickness of the layer. The variation in the ratios of silane and ammonia can be varied during use of a single source. According to an alternative elaboration of the invention, however, it is also possible that use is made of different sources, the silane/ammonia ratio of a first source being constant but different from a next source which also has a constant silane/ammonia ratio. In this manner, as it were, different $SiN_x$:H layers with different refractive indices are successively applied by successive sources. Further elaborations of the invention are described in the subclaims.

Figure 2:
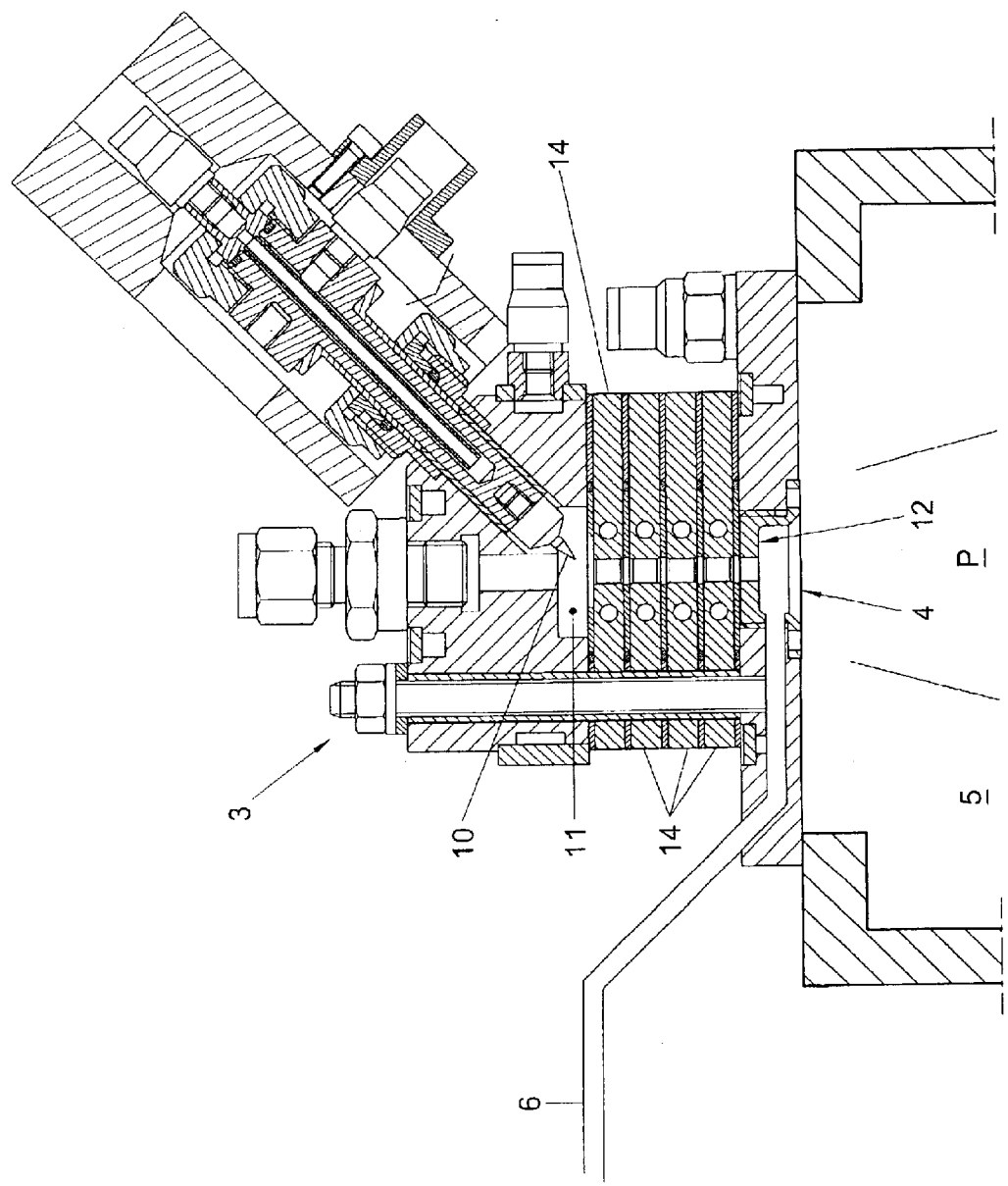

The invention will now be explained with reference to an exemplary embodiment and the drawing, wherein:

FIG. 1 diagrammatically shows, in cross-sectional view, an apparatus for treating a substrate; and FIG. 2 shows a detail of the cross-sectional view of FIG. 1, in which the plasma cascade source is shown.

The apparatus shown in the FIGS. 1 and 2 is provided with a PECVD processing chamber 5 on which a DC (direct current) plasma cascade source 3 is provided. The DC plasma cascade source 3 is arranged to generate a plasma with DC voltage. The apparatus is provided with a substrate holder 8 to hold one substrate 1 opposite an outlet opening 4 of the plasma source 3 in the processing chamber 5. The apparatus further comprises heating means (not shown) to heat the substrate 1 during the treatment.

As is shown in FIG. 2, the plasma cascade source 3 is provided with a cathode 10 that is present in a pre-chamber 11 and an anode 12 that is present at a side of the source 3 proximal to the processing chamber 5. Via a relatively narrow channel 13 and the plasma outlet opening 4, the pre-chamber 11 opens into the processing chamber 5. The apparatus is dimensioned such that the distance L between the substrate 1 and the plasma outlet opening 4 is approximately 200 mm–300 mm. In this manner, the apparatus can have a relatively compact design. The channel 13 is bounded by the mutually electrically insulated cascade plates 14 and the anode 12. During the treatment of a substrate, the processing chamber 5 is maintained at a relatively low pressure, in particular lower than 5000 Pa, and preferably lower than 500 Pa. Naturally, inter alia the treatment pressure and the dimensions of the processing chamber should be such that the growth process can still take place. In practice, the treatment pressure for a processing chamber of the present exemplary embodiment has been found to be at least approximately 0.1 mbar for this purpose. The pumping means needed to obtain the treatment pressure are not shown in the drawing. Between the cathode 10 and anode 12 of the source 3, a plasma is generated, for instance by ignition of an inert gas, such as argon, which is present therebetween. When the plasma has been generated in the source 3, the pressure in the pre-chamber 11 is higher than the pressure in the processing chamber 5. This pressure can be, for instance, substantially atmospheric and be in the range of 0.5–1.5 bar. Because the pressure in the processing chamber 5 is considerably lower than the pressure in the pre-chamber 11, a part of the generated plasma P expands such that it extends through the relatively narrow channel 13, from the outlet opening 4, into the processing chamber 5 to make contact with the surface of the substrate 1.

The apparatus is provided with gas supply means 6, 7 to supply flows of ammonia and silane respectively to the plasma P in the anode plate 12 of the source 3 and in the processing chamber 5 respectively. The ammonia supply means comprise an ammonia injector 6 that is arranged to introduce ammonia near the plasma source 3 in the plasma P. The silane supply means 7 are provided with a shower head 7 to supply silane downstream from the plasma outlet opening 4 near the substrate 1 to the plasma P. The apparatus is provided with ammonia and silane gas sources (not shown) that are connected via gas flow regulation means to the gas supply means 6, 7. In the present exemplary embodiment, during use, no reactive gases such as silane, ammonia, hydrogen and/or nitrogen are supplied to the plasma in the source 3, so that the source 3 cannot be affected by such gases.

For the passivation of the substrate 1, a plasma P is generated by the cascade source 3 in the manner described, such that the plasma P makes contact with the substrate surface of the substrate 1. Flows of silane and ammonia are supplied in a specific silane/ammonia ratio to the plasma P via the gas supply means 6, 7. In this, the process parameters of the PECVD process, at least the processing chamber pressure, the substrate temperature, the distance L between the plasma source 3 and the substrate 1, and the silane and ammonia flows are such that the $SiN_x$:H layer is deposited on the substrate 1 with an advantageous speed of more than 5 nm/s.

Since the plasma cascade source works under DC voltage to generate the plasma, the $SiN_x$:H layer can simply, substantially without adjustment during deposition, be grown at a constant growth rate. This is advantageous over use of a HF plasma source. Furthermore, with a DC plasma cascade source a relatively high growth rate can be achieved.

EXAMPLE

By means of a method according to the invention, a passivating $SiN_x$:H layer was deposited on a substrate surface of a polycrystalline silicon substrate with a growth rate of approximately 20 nm/s. In this, the process parameters were set at the values shown in Table 1. After deposition, approximately 15–20 atom% hydrogen was found to be incorporated in the $SiN_x$:H layer, while the atomic nitrogen/silicon ratio x in the $SiN_x$:H layer was in the range of 1.0–1.5. Then the substrate was subjected to a temperature treatment, with the $SiN_x$:H layer being held at a temperature in the range of 700–1000° C. for a relatively short heating period. After this temperature treatment, the substrate was found to have undergone both a good bulk and a good surface passivation and to show both a red and a blue response. In addition, the substrate obtained in this manner had an open terminal voltage of approximately 610 mV. Such a substrate is, for instance, very suitable to be used in a solar cell because of the high solar cell efficiency related to the terminal voltage. In this, the $SiN_x$:H layer can simply serve as an anti-reflection layer.

TABLE 1

| Process parameters | |
|---|---|
| flow of silane | 0.15 slm |
| flow of ammonia | 0.8 slm |

TABLE 1-continued

Process parameters

| | |
|---|---|
| substrate treatment temperature | 400° C. |
| distance L (source-substrate) | 230 mm |

Naturally, various modifications are possible within the scope of the invention as it is set forth in the following claims.

The thickness of the $SiN_x$:H layer deposited on the substrate by the PECVD process, for instance, can be in the range of 10–1000 nm.

Furthermore, substrates of various semiconductor materials can be used to be passivated using the method according to the invention.

In addition, the method can, for example, be carried out using more than one plasma source mounted on the processing chamber.

Furthermore, the substrate can, for instance, be loaded into the processing chamber 5 from a vacuum environment, such as a vacuumized load-lock mounted to the processing chamber. In that case, the pressure in the processing chamber 5 during the loading can be maintained at its desired low value. In addition, the substrate can, for instance, be brought into the processing chamber 5 when that chamber 5 is under atmospheric pressure, with chamber 5 then being closed and being evacuated by the pumping means to the desired pressure.

In addition, the cascade source can, for instance, generate a plasma that exclusively contains argon.

What is claimed is:

1. A method for the passivation of a semiconductor substrate, wherein a $SiN_x$:H layer is deposited on a surface of the substrate by a PECVD process, comprising:
   placing the substrate in a processing chamber which has specific internal processing chamber dimensions, such as at least one internal length, width, height and/or diameter;
   maintaining a pressure in the processing chamber at a relatively low value;
   maintaining the substrate at a specific treatment temperature;
   generating a plasma by at least one plasma cascade source mounted on the processing chamber at a specific distance from the substrate surface, wherein at least a part of the plasma generated by the at least one plasma cascade source is brought into contact with the substrate surface; and
   supplying a flow of silane and a flow of ammonia to said at least part of the plasma.

2. A method according to claim 1, wherein process parameters of the PECVD process, at least said processing chamber pressure, the flow of silane and the flow of ammonia, the substrate temperature, the dimensions of the processing chamber and the distance between the at least one plasma cascade source and the substrate surface, are such that the $SiN_x$:H layer is deposited on the substrate at a growth rate higher than 5 nm/s.

3. A method according to claim 1, wherein the flow of silane per cascade source is higher than approximately 0.05 slm.

4. A method according to claim 1, wherein the flow of ammonia per cascade source is higher than approximately 0.2 slm.

5. A method according to claim 2, wherein the distance between the at least one plasma cascade source and the substrate surface is in the range of approximately 100 mm–750 mm.

6. A method according to claim 1, wherein the ammonia is supplied to the plasma in the processing chamber near the at least one plasma cascade source.

7. A method according to claim 1, wherein the silane is supplied to the plasma near the substrate in the processing chamber.

8. A method according to claim 1, wherein said substrate temperature is in the range of 350–450° C.

9. A method according to claim 1, wherein the processing chamber pressure is lower than 5000 Pa.

10. A method according to claim 1, wherein the process parameters, at least silane flow to ammonia flow ratio, are such that approximately 15–20 atom % hydrogen is incorporated in the $SiN_x$:H layer during the deposition of the $SiN_x$:H layer.

11. A method according to claim 10, wherein said silane flow to ammonia flow ratio is in the range of 0.15–0.25.

12. A method according to claim 1, wherein the process parameters are such that the atomic nitrogen to silicon ratio x in the $SiN_x$:H layer is in the range of 1.0–1.5.

13. A method according to claim 1, wherein at least the $SiN_x$:H layer deposited on the substrate is subjected to a temperature treatment, wherein the $SiN_x$:H layer is maintained at a temperature in the range of 700–1000° C. for a specific heating period.

14. A method according to claim 1, wherein the thickness of the $SiN_x$:H layer deposited on the substrate by the PECVD process is in the range of 10–1000 nm.

15. A method according to claim 1, wherein the substrate is a polycrystalline silicon substrate.

16. A method according to claim 1, wherein in said at least one plasma cascade source a DC voltage is used to generate the plasma.

17. A method according to claim 1, wherein the substrate is subjected on both sides to the passivation.

18. A method according to claim 1, wherein a ratio between the flow of the silane and the flow of the ammonia is varied during application of the $SiN_x$:H layer.

19. A method according to claim 18, wherein the variation of the ratio is realized by successively using different sources, wherein in a first source, a first silane to ammonia ratio is constant, and in a second source, a second silane to ammonia ratio is also constant, said first ratio being different from said second ratio.

20. A method according to claim 18, wherein the variation of the ratio is realized by varying the flow of silane and the flow of ammonia in a single source.

21. An apparatus for the passivation of a semiconductor substrate, comprising:
   a processing chamber configured to house the substrate, said processing chamber being maintained at a relatively low pressure;
   a source of gas configured to supply a flow of silane and a flow of ammonia inside the processing chamber;
   a plasma cascade source mounted on the processing chamber at a specific distance from a surface of the substrate,
   wherein the plasma cascade source is configured to generate a plasma such that at least part of the plasma is brought in contact with the surface of the substrate.

* * * * *